United States Patent [19]

Tregilgas

[11] Patent Number: 5,028,296
[45] Date of Patent: Jul. 2, 1991

[54] ANNEALING METHOD

[75] Inventor: John H. Tregilgas, Richardson, Tex.

[73] Assignee: Texas Instruments Incorporated, Dallas, Tex.

[21] Appl. No.: 407,843

[22] Filed: Sep. 15, 1989

[51] Int. Cl.$^5$ .................... C30B 31/08; C30B 31/12
[52] U.S. Cl. .................... 156/620.2; 156/DIG. 72; 156/DIG. 73; 156/DIG. 82
[58] Field of Search .............. 156/DIG. 73, DIG. 72, 156/DIG. 82, 620.2

[56] References Cited

U.S. PATENT DOCUMENTS

| | | | |
|---|---|---|---|
| 4,190,486 | 2/1980 | Kyle | 156/DIG. 72 |
| 4,481,044 | 11/1984 | Schaake et al. | 437/247 |
| 4,536,227 | 8/1989 | Brice et al. | 148/13.1 |
| 4,866,007 | 9/1989 | Taguchi et al. | 156/DIG. 72 |

FOREIGN PATENT DOCUMENTS 2213403  8/1989  United Kingdom ............. 156/616.4

Primary Examiner—Gary P. Straub
Assistant Examiner—Stephen G. Kalinchak
Attorney, Agent, or Firm—Melvin Sharp; James T. Comfort; N. Rhys Merrett

[57] ABSTRACT

A three step annealing treatment for $Hg_{1-x}Cd_xTe$ includes a high temperature anneal to reduce excess tellurium, followed by an intermediate temperature anneal to reduce the supersaturation of metal vacancies, and lastly a low temperature anneal to reduce metal vacancies; see FIG. 4. The intermediate anneal reduces the metal vacancy concentration sufficiently that microvoids do not form from condensation of metal vacancies in desired portions of the $Hg_{1-x}Cd_xTe$ during the low temperature anneal. Alternate preferred embodiments include more than three steps and incremental cooling.

17 Claims, 4 Drawing Sheets

1

ANNEALING METHOD

CROSS-REFERENCE TO RELATED APPLICATIONS

Copending U.S. application Ser. No. 057,705, filed June 1, 1987 (Tregilgas, Kriss, and Weirauch) discloses related subject matter. This cross-referenced application is assigned to the assignee of this application.

BACKGROUND OF THE INVENTION

1. Field of the Invention

The present invention relates to preparation of semiconductor materials, and, more particularly, to the preparation of mercury cadmium telluride and related materials.

2. Description of the Related Art

Alloys of mercury telluride and cadmium telluride, generically denoted $Hg_{1-x}Cd_xTe$, are extensively employed as photosensitive semiconductors for infrared radiation. Indeed, $Hg_{0.8}Cd_{0.2}Te$ has a bandgap of about 0.1 eV which corresponds to a photon wavelength of 12 $\mu$m and $Hg_{0.73}Cd_{0.27}Te$ a bandgap of about 0.24 eV corresponding to a photon wavelength of 5 $\mu$m; and these two wavelengths are in the two atmospheric windows of greatest interest for infrared detectors.

Reproducible preparation of $Hg_{1-x}Cd_xTe$ with low defect densities has proved to be difficult. Typical preparation methods include a recrystallization at high temperatures followed by a low temperature anneal of the ingot in a saturated mercury atmosphere; the recrystallization at high temperatures generates excess tellurium and metal vacancies, and the low temperature anneal reduces the concentration of metal vacancies. FIG. 1a illustrates this preparation: point "A" is the recrystallization, the vertical down arrow from "A" represents the cooling of the ingot, the vertical up arrow represents heating the ingot up to anneal temperature, and the horizontal arrow represents the low temperature anneal resulting in the composition represented by point "B".

The method of U.S. Pat. No. 4,481,044 (Schaake and Tregilgas) for $Hg_{1-x}Cd_xTe$ with $x \approx 0.2$ includes recrystallization at a temperature in the range of 650° to 670° C. followed by a high temperature anneal of the ingot at about 600° C. in a mercury atmosphere to reduce the excess tellurium and attendant dislocations. Subsequently, slices are annealed at a low temperature about 270° C. in a mercury atmosphere for extended times to reduce the concentration of metal vacancies; this processing yields an n-type skin free of excess tellurium and a p-type core of condensed metal vacancies, precipitated tellurium, and gettered impurities. The thickness of the n-type skin increases with increasing anneal times, and with long anneal times the p-type core is annihilated. FIG. 1b illustrates this method.

Devices are fabricated in the n-type skin, which for bulk recrystallized $Hg_{1-x}Cd_xTe$ may range from about 100 $\mu$m to 350 $\mu$m or more in thickness. Usually the annealed surface of a the $Hg_{1-x}Cd_xTe$ is removed by polishing and etching to prepare it for device fabrication. The amount of material removed from the surface of the $Hg_{1-x}Cd_xTe$ depends on the type of devices being fabricated and their sensitivity to surface damage from handling, as well as, variations in material properties which can come from in-diffusion of surface contamination impurities. Usually more than 25 $\mu$m of surface material is removed for device preparation. For example, in U.S. Pat. No. 4,686,373 (Tew and Lewis) a slice of $Hg_{1-x}Cd_xTe$ is first lapped and polished and then glued to a silicon chip containing processing circuitry. Next, the $Hg_{1-x}Cd_xTe$ is thinned down to a thickness of about 12 $\mu$m, and an insulator plus transparent gate are deposited on the exposed surface to form the infrared detector. In this case, the portion of the original $Hg_{1-x}Cd_xTe$ slice that is used for the infrared detector was several $\mu$m below the original surface of the slice.

However, the known preparation methods for $Hg_{1-x}Cd_xTe$ do not provide slices with uniform electrical properties as a function of depth in regions where infrared detectors are usually built.

SUMMARY OF THE INVENTION

The present invention provides methods of preparation of $Hg_{1-x}Cd_xTe$ and related compounds that include an intermediate temperature anneal to reduce metal vacancy supersaturation prior to a low temperature anneal to reduce agglomeration of metal vacancies. It has been discovered that metal vacancies can agglomerate to form microvoids during the low temperature anneal, and these microvoids cause deterioration of electrical characteristics of the $Hg_{1-x}Cd_xTe$. Use of an intermediate temperature anneal deters microvoid formation during the low temperature anneal and results in material with improved electrical uniformity with depth compared to material produced with known preparation methods.

BRIEF DESCRIPTION OF THE DRAWINGS

The drawings are schematic for clarity.

DESCRIPTION OF THE PREFERRED EMBODIMENTS

Figure 1A:
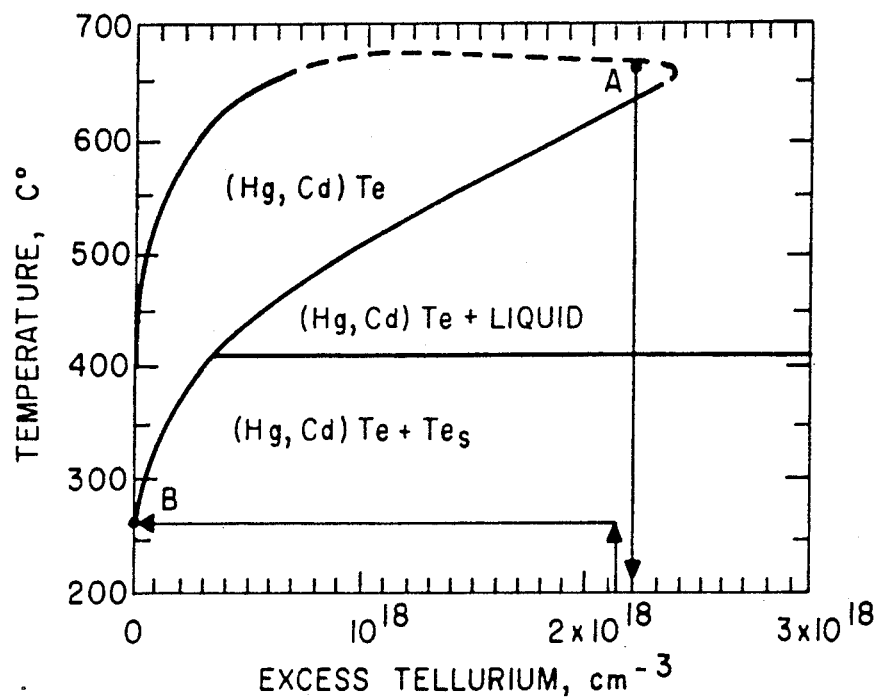
FIGS. 1a-b are phase diagrams illustrating prior art methods.
Figure 1B:
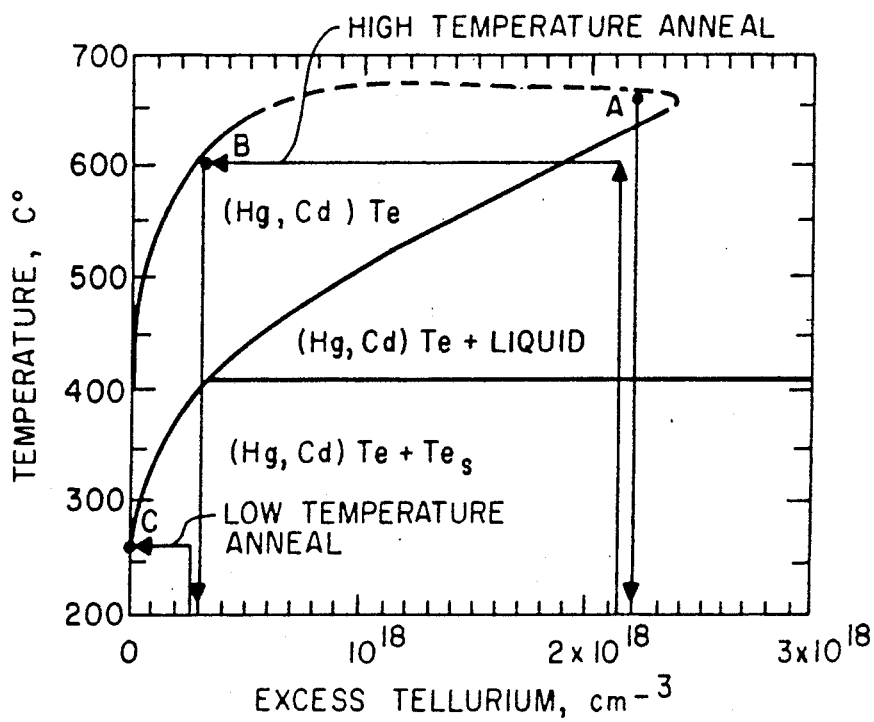

The first preferred embodiment method is best understood by first considering the prior art method of preparation of $Hg_{1-x}Cd_xTe$ of U.S. Pat. No. 4,481,044. FIG. 1b is a phase diagram (after H. F. Schaake, 14 J.Elec.-Mat. 513 (1984)) illustrating the equilibrium composition of $Hg_{1-x}Cd_xTe$ with excess tellurium for temperatures between 200° C. and 700° C., and shows that $Hg_{1-x}Cd_xTe$ only exists with tellurium in excess of stoichiometry at high temperatures. The horizontal arrows in FIG. 1a indicate the indiffusion of mercury during annealing and the combination of this mercury with the excess tellurium and filling of the metal vacancies. Note that the tellurium excess is on the order of hundreds of parts per million.

Figure 2A:
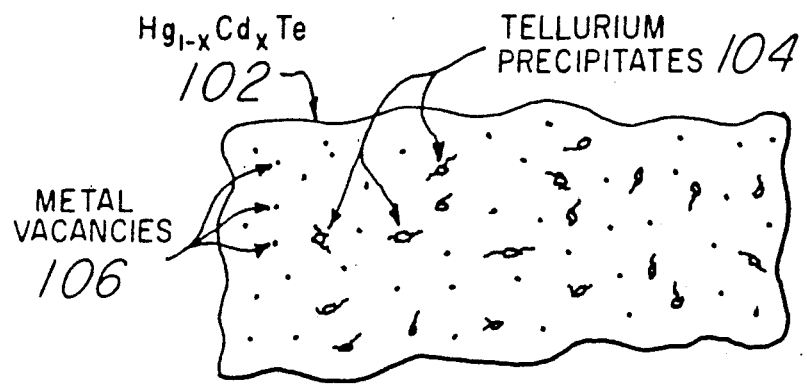
FIGS. 2a-c are cross sectional elevation views illustrating a prior art method.
Figure 2B:
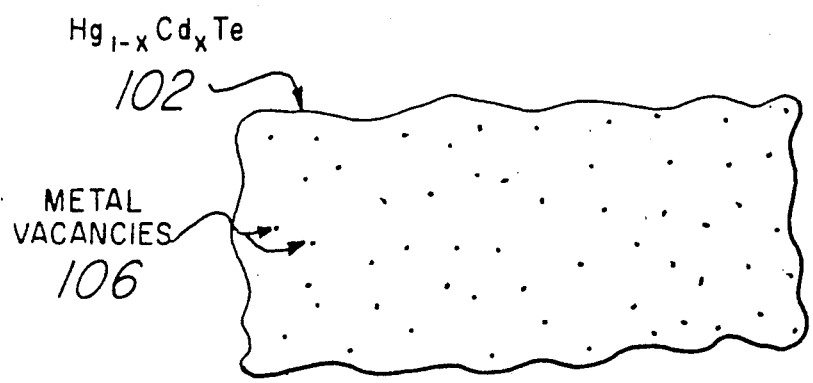
Figure 2C:
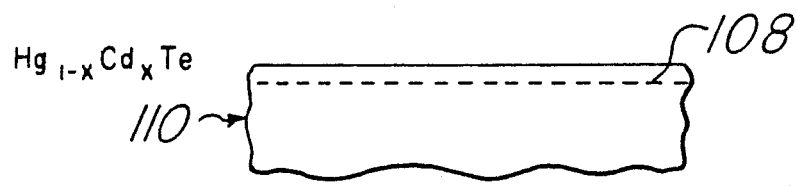

FIGS. 2a-c schematically illustrate in cross sectional elevation views the following steps of the preparation method:

(a) $Hg_{1-x}Cd_xTe$ material with $x \approx 0.2$ is recrystallized at about 650° C. to form ingot 102 which is about 8 mm by 8 mm by 65 mm. Because $Hg_{1-x}Cd_xTe$ exists at high temperatures only with tellurium in excess of stoichiometry, ingot 102 will have a concentration of excess tellurium on the order of $10^{18}$ atoms/cm$^3$. See point "A" in FIG. 1b. This excess tellurium is accommodated with vacancies on the metal sublattice. Upon cooling, excess tellurium precipitates and metal vacancies agglomerate and produce defects, namely tellurium-microvoid complexes (see H. F. Schaake and J. H. Tregilgas, 12 J.Elec.Mat. 931 (1983)). The defects are suggested by reference numeral 104 and metal vacancies by reference numeral 106 in FIG. 2a.

(b) Ingot 102 is annealed at 600° C. in a mercury atmosphere for seven days. This anneal allows mercury to diffuse into ingot 102 and combine with the excess tellurium and metal vacancies, and also allows dislocations to move. This combination with tellurium stops when the phase boundary is reached as illustrated by point "B" in FIG. 1b and results in material with a metal vacancy concentration of about 2 or $3 \times 10^{17}$ vacancies/cm$^3$. See FIG. 2b for a schematic illustration. Alternatively, annealing the Hg$_{1-x}$Cd$_x$Te at 550° C. with a mercury atmosphere has also been used and produces material with about 1 or $2 \times 10^{17}$ vacancies/cm$^3$. Hall measurements at liquid nitrogen temperatures can be used to establish the vacancy concentration from this anneal using quenched samples. While lower temperatures can also be used, much longer annealing times are necessary to produce a uniform vacancy concentration thoughout a Hg$_{1-x}$Cd$_x$Te ingot.

(c) Ingot 102 is cooled and cut into slices 110 which are about 20 mm by 5 mm by 1 mm.

(d) Slices 110 are then annealed at 270° C. in a mercury atmosphere for between three days to seven days which decreases the metal vacancies by diffusing in mercury; see point "C" in FIG. 1b. This low temperature anneal converts the Hg$_{1-x}$Cd$_x$Te from p-type to n-type. The n-type portion of the annealed slice 110 is then used in the fabrication of devices with the portion of slice 110 about 50-100 μm below the surface (indicated by dashed line 108 in FIG. 2c) ending up in the devices. Alternatively, other annealing temperatures below 270° C. can be used for the Hg$_{1-x}$Cd$_x$Te to produce n-type material. The depth of the n-type surface depends on the amount of excess tellurium established by the previous anneal and the diffusivity of Hg at a specific annealing temperature (see H. F. Schaake et al., 3 J.Vac.Sci.Tech.A, 143 (1985)).

Figure 3:
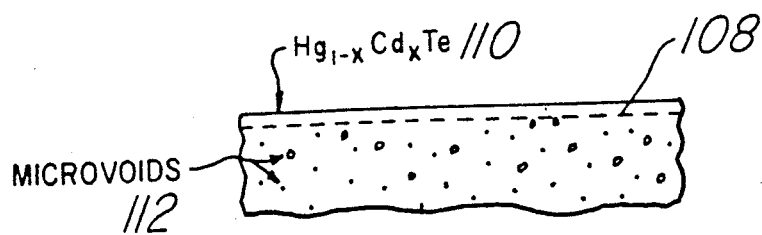
FIG. 3 is a cross sectional elevation view illustrating a first preferred embodiment method.

The first preferred embodiment method includes the discovery that during the low temperature anneal of the prior art method described supra, the metal vacancies can agglomerate into microvoids 112 of size on the order of 400 Å or less. The mercury diffusing into slice 110 during the anneal can remove the metal vacancies before agglomeration into microvoids in the top 30-60 μm of the slice, but the remainder of slice 110 will likely be permeated with microvoids 112. Thus after the low temperature anneal, FIG. 3 is a more accurate representation of slice 110 than FIG. 2c, and micro oids 112 may or may not be present in the zone indicated by dashed line 108. Microvoids 112 have a strong influence on both the electrical characteristics of the Hg$_{1-x}$Cd$_x$Te and the performance of devices. Presence of the microvoids is probably the source of performance problems in material produced by known methods.

Figure 4:
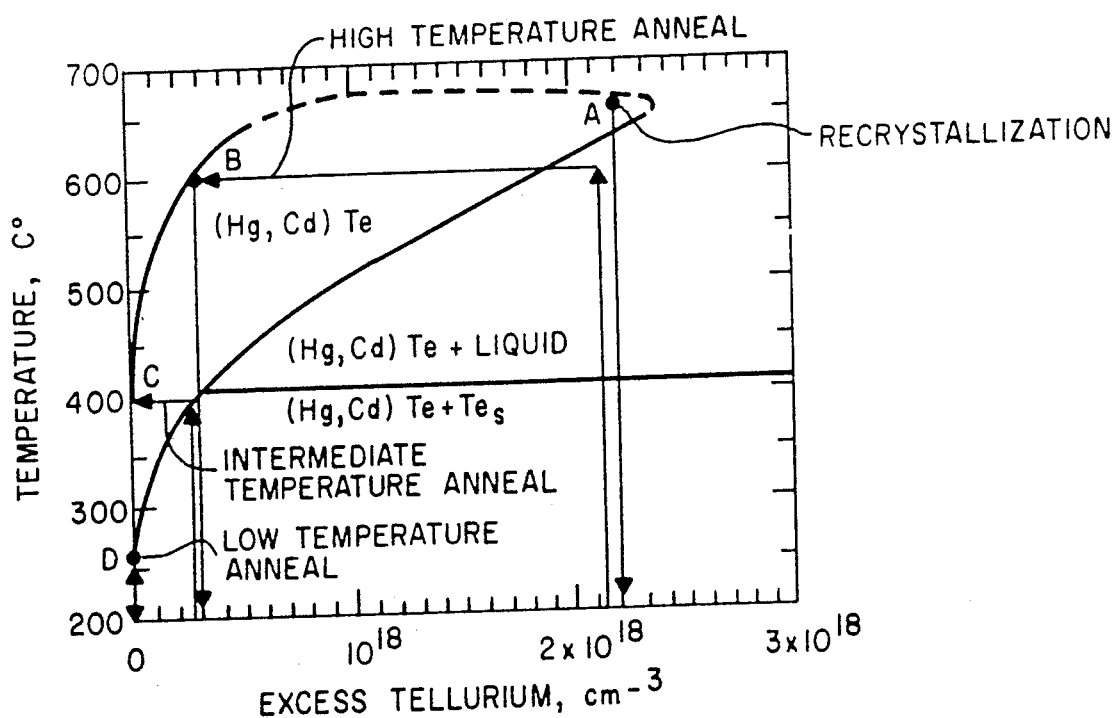
FIG. 4 is a phase diagram illustrating a first preferred embodiment method.

The first preferred embodiment method adds an extra anneal step to deter microvoid formation, and includes the following steps:

(a) Hg$_{1-x}$Cd$_x$Te material with $x \approx 0.2$ is recrystallized at about 650° C. to form ingot 202 which is about 8 mm by 8 mm by 65 mm. This is represented by point "A" in FIG. 4. Ingot 202 will have on the order of $10^{18}$ atoms/cm$^3$ of excess tellurium which are accommodated with vacancies in the metal sublattice. Upon cooling, the excess tellurium precipitates and produces defects. See the downward vertical arrow from "A" in FIG. 4.

(b) Ingot 202 is annealed at 600° C. for seven days (alternatively, at 550° C.) in a mercury rich atmosphere. This high temperature anneal allows mercury to diffuse into ingot 202 and combine with the excess tellurium and also allows dislocations to move; however, metal vacancies 206 still remain with a concentration on the order of $2 \times 10^{17}$ vacancies/cm$^3$. See the left arrow ending a point "B" FIG. 4 which represents this high temperature anneal.

(c) Ingot 202 is annealed at 400° C. in a saturated mercury atmosphere for fourteen days. This allows mercury to diffuse into the ingot 202 and reduces the metal vacancies 206 concentration to the order of $7 \times 10^{15}$ vacancies/cm$^3$. See left arrow ending a "C" in FIG. 4 which represents this intermediate temperature anneal.

(d) Ingot 202 is cooled and cut into slices 210 which are about 20 mm by 5 mm by 0.5 mm.

(e) Slices 210 are then annealed at 270° C. in a mercury atmosphere for about 1 day to remove the metal vacancies by diffusing in mercury. This low temperature anneal is represented by point "D" in FIG. 4; the change in excess tellurium during the anneal is too small to see in FIG. 4. The low concentration of metal vacancies 206 prior to the anneal prevents the agglomeration of the vacancies into microvoids.

The reason for the prevention of microvoid agglomeration may be as follows. The nucleation rate (after H. Weidersich and J. K. Katz, "Correlation of Neutron and Charged Particle Damage", June 8-19, 1976, Oak Ridge, Tenn. pp. 21-59) for microvoid agglomeration during an anneal appears to depend upon a factor such as:

$$c \in -16.75 V2Q3/[kT]3[lnS]2$$

where c is a constant, Q is surface energy, V is the volume of the agglomerate, and S is the supersaturation of metal vacanices at the anneal temperature with S defined as the ratio of the mercury-saturated equilibrium metal vacancy concentration at the previous high temperature to that at the lower anneal temperature.

The prior art method has S approximately equal to 2000 for the 270° C. low temperature anneal after a 550° C. to 600° C. high temperature anneal (the metal vacancy concentration is about $2 \times 10^{17}$ at 550° C. and about $1 \times 10^{14}$ at 270° C., so the ratio is 2000), and this large value of S leads to rapid nucleation of microvoids. Contrarily, the first preferred embodiment method has a S equal to about 25 for the 400° C. intermediate temperature anneal after a 550° C. high temperature anneal, and a S equal to about 80 for the 270° C. low temperature anneal after the 400° C. anneal. These nucleation rates are small enough to permit the indiffusing mercury time to fill the vacancies prior to significant microvoid formation. Alternatively, keeping S less than 500 for the intermediate temperature anneal and keeping S less than 1000 for the low temperature anneal should give tolerable results; whereas, keeping S less than 50 for the intermediate temperature anneal and S less than 300 for the low temperature anneal should give good results.

The second preferred embodiment method of preparation of $Hg_{1-x}Cd_xTe$ is similar to the first preferred embodiment method but with a change in the order of steps (c) and (d). In more detail, after the dislocation reduction (high temperature) anneal at 550° C. to 600° C. of step (b), ingot 202 is cut into slices 210 and slices 210 are annealed at 400° C. in a saturated mercury atmosphere for 1-2 hours to reduce the supersaturation of metal vacancies near the slice surface (to a depth of at least 100 $\mu$m). The subsequent 270° C. anneal also will have a small enough supersaturation of metal vacanices near the slice surface to avoid nucleation of microvoids in the 100 $\mu$m near the surface, thus making the near surface of the material suitable for infrared devices. However, microvoids can form at deeper depths within the slice.

The third preferred embodiment method of preparation of $Hg_{1-x}Cd_xTe$ is similar to the second prefered embodiment method, but with the 400° C. anneal extended for several days; this reduces the metal vacancy supersaturation throughout slice 210 and fully suppresses microvoid formation during the subsequent anneal at 270° C. Actual annealing times to achieve a uniform vacancy concentration through the entire slice at 400° C. depend on the slice thickness. Typically, several days are required for slices in the range of about 760 $\mu$m thick. Shorter times are required for thinner slices.

Figure 5:
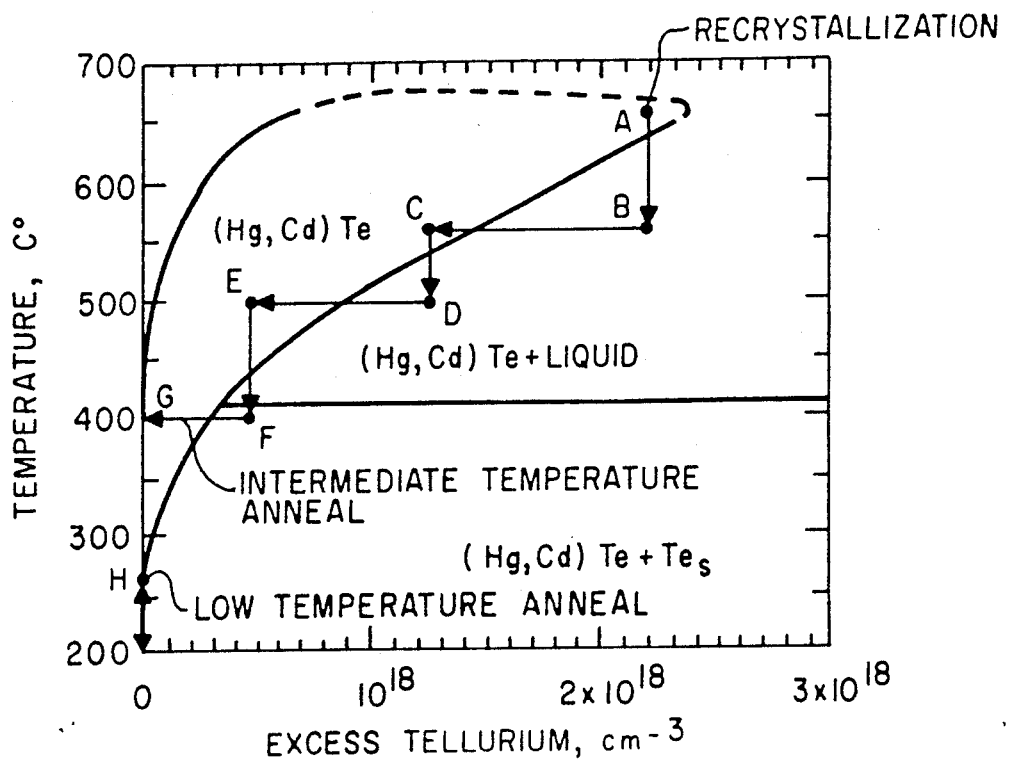
FIG. 5 is a phase diagram illustrating a fourth preferred embodiment method.

The fourth preferred embodiment method of preparation of $Hg_{1-x}Cd_xTe$ is to slowly cool the $Hg_{1-x}Cd_xTe$ from the recrystallization temperature of about 650° C. while providing a source of mercury and allowing the $Hg_{1-x}Cd_xTe$ sample to periodically equilibrate with the mercury source until the sample is equilibrated with the mercury source at a temperature of 400° C. Cooling can be either continuous or in stepped increments but with the supersaturation, S, between increments less than 200. (Note that for a 400° C. anneal directly after a recrystallization at 650° the supersaturation $S=650$.) After the continuous or incremental (or a mixture) equilibrating cooling to 400° C., the intermediate temperature anneal at 400° is performed, and lastly, the 270° anneal is performed as in the first preferred embodiment. FIG. 5 illustrates the fourth preferred embodiment with two equilibrating increments "B"-"C" and "D"-"E" followed by the intermediate temperature anneal "F"-"G" and the low temperature anneal "H".

Figure 6:
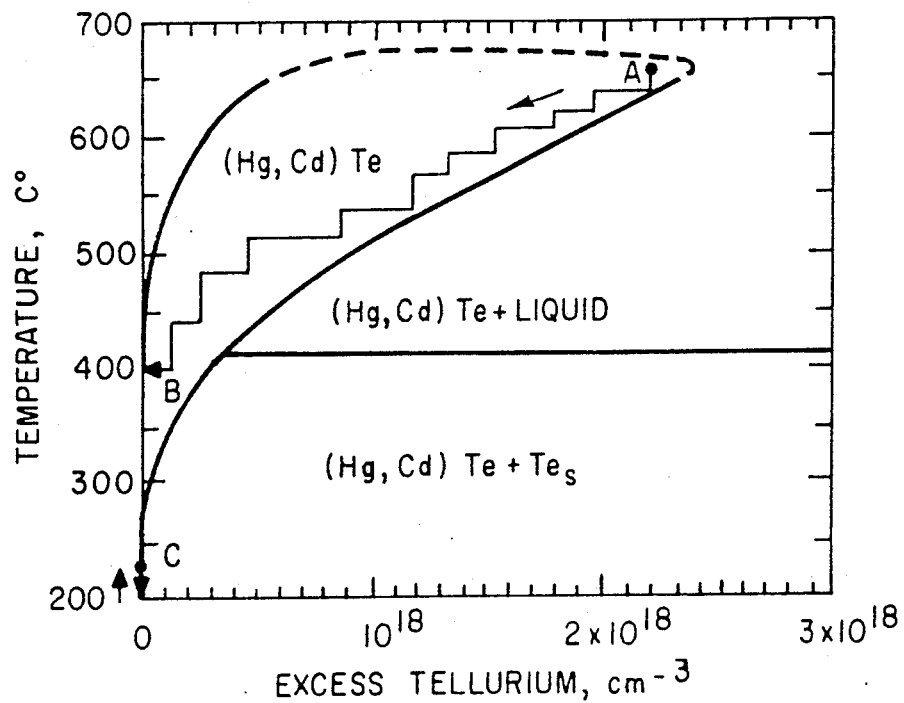
FIG. 6 is a phase diagram illustrating a fifth preferred embodiment method.

The fifth preferred embodiment method of preparation of $Hg_{1-x}Cd_xTe$ is incremental cooling plus annealing in many steps from the recrystallization to a low temperature anneal (such as 220° C.) with each incremental anneal having a supersaturation, S, less than 200 while maintaining the material within the mercury and tellurium saturated phase limits. See FIG. 6 which shows the incremental coolings and annealings from recrystallization at 650° C. at point "A" to an annealing at 400° C. at point "B" followed by a low temperature annealing at 220° C. at point "C" to form the n-type skin. A continuous change of temperature could replace some or all of the increments, but incremental cooling and annealing is simpler to perform.

MODIFICATIONS AND ADVANTAGES

Various modifications of the preferred embodiment devices and methods may be made while retaining the features of a reduction of the metal vacancy supersaturation to deter microvoid formation during annealing.

Other mercury-component semiconductors such as $Hg_{1-x-y}Cd_xZn_yTe$ [(HgCdZn)Te], (HgMnCdZn)(TeSe), and so forth, or thin films of such materials on substrates such as CdTe, CdTeSe and CdZnTe, or material grown by liquid phase epitaxy, vapor phase epitaxy, travelling heater, Czochralski growth, Bridgman growth, or slush growth may be treated in the same manner: an intermediate anneal to reduce supersaturation of metal vacancies to deter subsequent condensation to microvoids. Of course, the particular times and temperatures for the various anneals will depend upon the particular materials used.

The invention provides the advantage of avoidance of microvoids which may disrupt electrical characteristics.

What is claimed is:

1. A method of $Hg_{1-x}Cd_xTe$ treatment, comprising the steps of:
   (a) providing a body of $Hg_{1-x}Cd_xTe$;
   (b) placing said body of $Hg_{1-x}Cd_xTe$ in an atmosphere sufficiently rich in mercury to allow said mercury to diffuse into said body; and
   (c) annealing said body of $Hg_{1-x}Cd_xTe$ in said atmosphere sufficiently rich in mercury to allow said mercury to diffuse into said body at at least three successively lower temperatures to deter microvoid formation in said body.

2. A method of $Hg_{1-x}Cd_xTe$ treatment, comprising the steps of:
   (a) providing a body of $Hg_{1-x}Cd_xTe$;
   (b) annealing said body of $Hg_{1-x}Cd_xTe$ at a first temperature;
   (c) placing said body of $Hg_{1-x}Cd_xTe$ from step (b) in an atmosphere sufficiently rich in mercury to allow said mercury to diffuse into said body;
   (d) next annealing said body at a second temperature in an atmosphere sufficiently rich in mercury to allow said mercury to diffuse into said body, said second temperature being at least 100° C. lower than said first temperature; and
   (e) then annealing said body at a third temperature in an atmosphere sufficiently rich in mercury to allow said mercury to diffuse into said body, said third temperature being at least 100° C. lower than said second temperature.

3. The method of claim 2, wherein:
   (a) said body is divided into smaller pieces between steps (b) and (d).

4. The method of claim 2, wherein:
   (a) said body is divided into smaller pieces between steps (d) and (e).

5. A method of mercury-component semiconductor material treatment, comprising the steps of:
   (a) annealing a body of mercury-component semiconductor material at a first temperature in a mercury ambient sufficiently rich in mercury to allow said mercury to diffuse into said body;
   (b) next annealing said body from step (a) at a second temperature lower than said first temperature in a mercury ambient sufficiently rich in mercury to allow said mercury to diffuse into said body to provide a supersaturation of metal vacancies in said mercury-component semiconductor material of less than 500; and
   (c) then annealing said body (from step b) at a third temperature lower than said second temperature in a mercury ambient sufficiently rich in mercury to allow said mercury to diffuse into said body to provide a supersaturation of metal vacancies in said mercury-component semiconductor of less than 1000.

6. The method of claim 5, wherein:
(a) the supersaturation in step (b) is less than 50.

7. The method of claim 5, wherein:
(a) the supersaturation in step (c) is less than 300.

8. The method of claim 5, further comprising the step of:
(a) lastly annealing said body at a fourth temperature in a mercury ambient,
(b) wherein the supersaturation steps at each of the second, third, and fourth anneals is less than 200.

9. The method of claim 5, wherein:
(a) said semiconductor is $Hg_{1-x}Cd_xTe$; and
(b) said semiconductor is maintained within the mercury and tellurium saturated phase limits.

10. The method of claim 9, further comprising the step of:
(a) lastly annealing said body at a fourth temperature in a mercury ambient,
(b) wherein the supersaturation steps at each of the second, third, and fourth anneals is less than 200.

11. The method of claim 1 wherein said mercury cadmium telluride in step (a) is recrystallized.

12. The method of claim 2 wherein said mercury cadmium telluride in step (a) is recrystallized.

13. The method of claim 5 wherein said mercury-component semiconductor material in step (a) is recrystallized.

14. The method of claim 2 wherein said first temperature is about 600° C. said second temperature is about 400° C. and said third temperature is about 270° C.

15. The method of claim 12 wherein said first temperature is about 600° C. said second temperature is about 400° C. and said third temperature is about 270° C.

16. The method of claim 5 wherein said first temperature is about 600° C. said second temperature is about 400° C. and said third temperature is about 270° C.

17. The method of claim 13 wherein said first temperature is about 600° C. said second temperature is about 400° C. and said third temperature is about 270° C.

* * * * *